United States Patent [19]
Oh

[11] Patent Number: 5,543,750
[45] Date of Patent: Aug. 6, 1996

[54] BOOTSTRAP CIRCUIT

[75] Inventor: Young N. Oh, Kyoungki-Do, Rep. of Korea

[73] Assignee: Hyundai Electronics Industries Co. Ltd., Kyoungkyo-do, Rep. of Korea

[21] Appl. No.: 348,192

[22] Filed: Nov. 29, 1994

[30] Foreign Application Priority Data

Dec. 1, 1993 [KR] Rep. of Korea ............ 93-26087

[51] Int. Cl.⁶ .................................................. H03K 4/58
[52] U.S. Cl. ............................ 327/589; 327/390; 327/306
[58] Field of Search ........................... 327/306, 589, 327/536, 537, 538, 541, 543

[56] References Cited

U.S. PATENT DOCUMENTS

| | | | |
|---|---|---|---|
| 4,692,904 | 9/1987 | Sato et al. ........................ | 365/226 |
| 4,905,314 | 2/1990 | Kato et al. ....................... | 327/589 |
| 5,162,668 | 11/1992 | Chen et al. ..................... | 327/589 |
| 5,184,035 | 2/1993 | Sugibayashi .................... | 327/536 |
| 5,363,333 | 11/1994 | Tsujimoto ....................... | 327/538 |
| 5,388,084 | 2/1995 | Itoh et al. ....................... | 327/540 |

*Primary Examiner*—Timothy P. Callahan
*Assistant Examiner*—My-Trang Nu Ton
*Attorney, Agent, or Firm*—Gary M. Nath; Nath & Associates

[57] ABSTRACT

An improved bootstrap circuit comprising a booster for boosting a binary signal and outputting the boosted binary signal through its output terminal, a voltage detector for detecting a variation of a supply voltage from a supply voltage source, and an active load for adjusting an output load amount of the booster under control of the voltage detector. According to the present invention, the binary signal is boosted to a voltage level which is stable regardless of the variation of the supply voltage.

4 Claims, 4 Drawing Sheets

BOOTSTRAP CIRCUIT

BACKGROUND OF THE INVENTION

1. Field of the Invention

The present invention relates in general to a bootstrap circuit for boosting a binary signal of specified logic, and more particularly to an improved bootstrap circuit for adjusting an output load amount according to a variation of a supply voltage to boost the binary signal to a desired voltage level.

2. Description of the Prior Art

Generally, a bootstrap circuit functions, such as a typical amplifier, to boost an input signal. In practice, the bootstrap circuit boosts a binary signal to be supplied to a word line of a semiconductor memory device and a pull-up driver of a data output buffer thereof consisting of NMOS transistors, so as to enhance an operation speed and a reliability of the semiconductor memory device.

Such a conventional bootstrap circuit has a fixed amount of output load and a constant boosting efficiency due to the fixed output load amount. For this reason, when a supply voltage is varied, the conventional bootstrap circuit generates an output signal with a boosted voltage level varied with the variation of the supply voltage. The variation of the boosted voltage level degrades the operation speed and the reliability of the semiconductor memory device. Such a problem with the conventional bootstrap circuit will hereinafter be described with reference to FIGS. 1 and 2.

Referring to FIG. 1, there is shown a circuit diagram of the conventional bootstrap circuit for the data output buffer of the semiconductor memory device which is designated by the reference numeral 3. As shown in this drawing, the conventional bootstrap circuit comprises a booster 1 for boosting a data signal from a node N0 and a voltage compensator 2 for compensating for a voltage loss of the data signal boosted by the booster 1.

The booster 1 is adapted to boost the data signal from the node N0 and supply the boosted data signal through a node N5 to a gate of an NMOS transistor Q3 of the data output buffer 3. To this end, the booster 1 includes two NMOS transistors Q1 and Q2, six inverters G1–G6 and a capacitor CAP1. The operation of the booster 1 with the above-mentioned construction will hereinafter be described.

First, in the case where the data signal at the node N0 is high in logic, a low logic signal is generated at a node N1 by the inverter G1. A high logic signal is generated at a node N2 after the lapse of a first predetermined time period from the application of the high data signal to the node N0. A voltage of "Vcc–Vt" is maintained at a node N3 by the NMOS transistor Q2, where Vcc is a first supply voltage from a first supply voltage source Vcc and Vt is a threshold voltage of the NMOS transistor Q2. The first predetermined time period corresponds to the sum of propagation delay times of the two inverters G2 and G3 connected in series between the nodes N0 and N2. As the NMOS transistor Q1 is turned on by the voltage Vcc–Vt at the node N3, the same low logic signal as that at the node N1 is maintained at the node N5. A low logic signal is maintained at a node N4 after the lapse of the first predetermined time period from the application of the high data signal to the node N0. With the low logic signals maintained at the nodes N4 and N5, a voltage of 0 V from the capacitor CAP1 is transferred through the node N5 to the gate of the NMOS transistor Q3 of the data output buffer 3.

On the other hand, in the case where the data signal at the node N0 is transited from its high logic to its low logic, the logic signal at the node N1 is changed from its low level to its high level by the inverter G1. The voltage Vcc–Vt at the node N3 is boosted to at least "Vcc+2Vt" under the influence of a parasitic capacitor which is present between a source and a gate of the NMOS transistor Q1. The boosted voltage Vcc+2Vt at the node N3 causes the NMOS transistor Q1 to transfer the high logic signal at the node N1 to the node N5 with no loss, so as to charge the capacitor CAP1.

After the lapse of the first predetermined time period from the moment that the data signal at the node N0 is transited from its high logic to its low logic, a low state is maintained at the node N2 by the delayed data signal from the inverter G3, thereby causing the NMOS transistor Q2 to be turned off. With the NMOS transistor Q2 turned off, the node N5 is floated at a high state. After the lapse of a second predetermined time period from the moment that the data signal at the node N0 is transited from its high logic to its low logic, a high state is maintained at the node N4 by a logic signal from the inverter G6, thereby causing a voltage at the node N5 to be boosted to at least "Vcc+3Vt". The boosted voltage at the node N5 is applied to the gate of the NMOS transistor Q3 of the data output buffer 3.

The voltage compensator 2 is adapted to input a pulse signal from a ring oscillator (not shown) through a node N6 and supply periodically a voltage to the node N5 in response to the inputted pulse signal, to make up for the voltage loss caused with the lapse of time. To this end, the voltage compensator 2 includes a capacitor CAP2 and three NMOS transistors Q5–A7, as shown in FIG. 2.

In FIG. 2, the NMOS transistor Q7 is turned on when the voltage at the node N5 is about "Vcc+3Vt", thereby causing the first supply voltage from the first supply voltage source Vcc to be transferred to a node N7 through the NMOS transistor Q6, which acts as a resistor. When the pulse signal applied through the node N6 from the ring oscillator (not shown) remains at its high logic, the voltage at the node N7 is boosted to at least "Vcc+3Vt" by the capacitor CAP2. Then, the boosted voltage Vcc+3Vt at the node N7 is transferred to the node N5 by the NMOS transistor Q5, so as to compensate for the voltage loss at the capacitor CAP1 in FIG. 1. At this time, the capacitor CAP1 is charged with the voltage from the NMOS transistor Q5.

However, the above-mentioned conventional bootstrap circuit has the disadvantage that the data signal is boosted to an exceedingly high voltage level when the supply voltage is high, because the boosting efficiency is constant regardless of the variation of the supply voltage. For this reason, the conventional bootstrap circuit degrades the operation speed of the data output buffer and, thus, the reliability of the semiconductor memory device.

SUMMARY OF THE INVENTION

Therefore, the present invention has been made in view of the above problem, and it is an object of the present invention to provide an improved bootstrap circuit for boosting an input signal to a voltage level which is stable regardless of a variation of a supply voltage.

In accordance with the present invention, the above and other objects can be accomplished by a provision of an improved bootstrap circuit comprising boosting means for boosting a binary signal and outputting the boosted binary signal through its output terminal; voltage detection means for detecting a variation of a supply voltage from a supply voltage source; and an active load for adjusting an output load amount of said boosting means under control of said voltage detection means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 3:
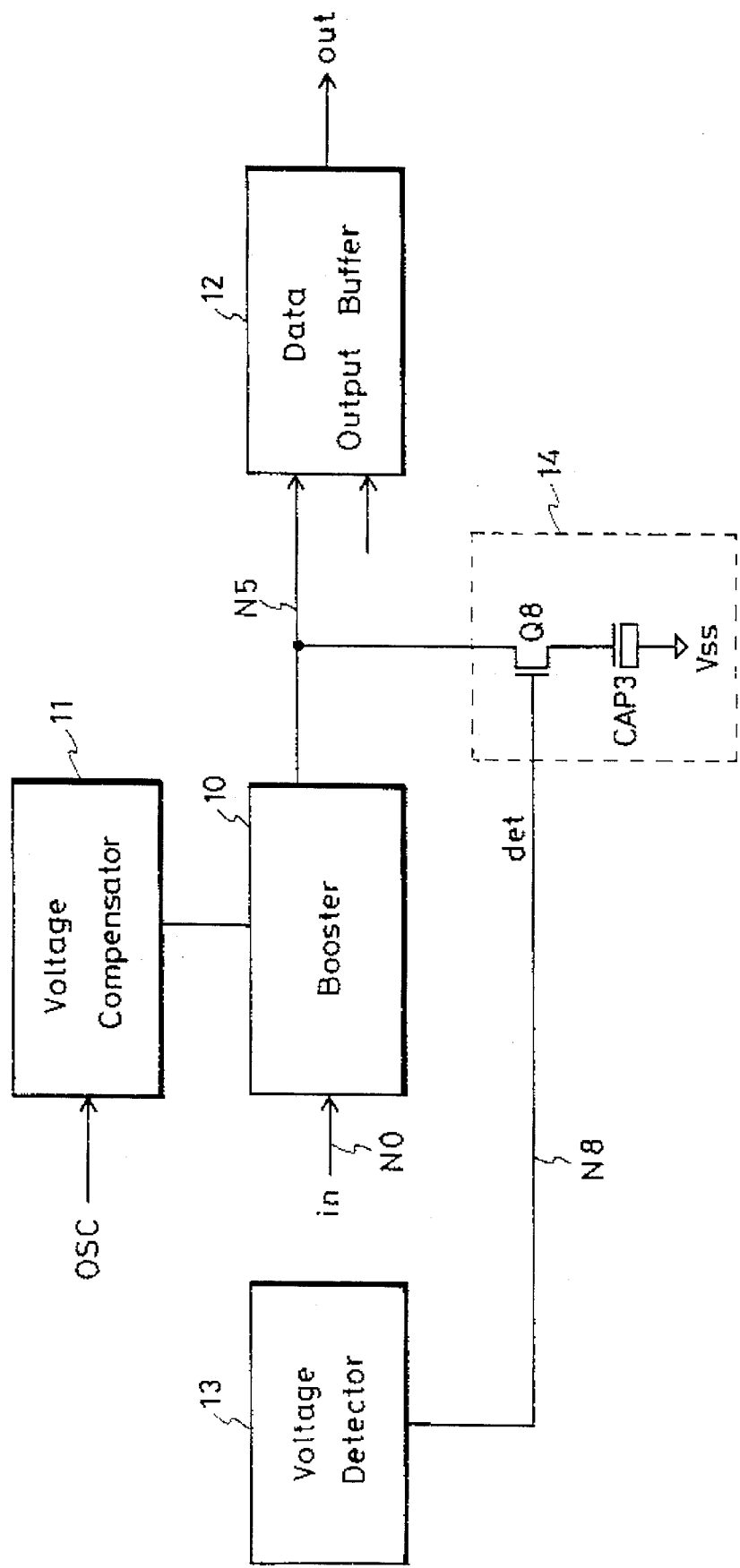
FIG. 3 is a circuit diagram of an improved bootstrap circuit for a data output buffer of a semiconductor memory device in accordance with an embodiment of the present invention.

Referring to FIG. 3, there is shown a circuit diagram of an improved bootstrap circuit for a data output buffer of a semiconductor memory device in accordance with an embodiment of the present invention. Some of parts in this drawing are the same as those in FIG. 1. Therefore, like reference numerals designate like parts. Also in this drawing, the data output buffer is designated by the reference numeral 12. As shown in this drawing, the improved bootstrap circuit comprises a booster 10 for boosting the data signal from the node N0 and supplying the boosted data signal through the node N5 to the data output buffer 12, and a voltage compensator 11 for compensating for a voltage loss of the data signal boosted by the booster 10.

Figure 1:
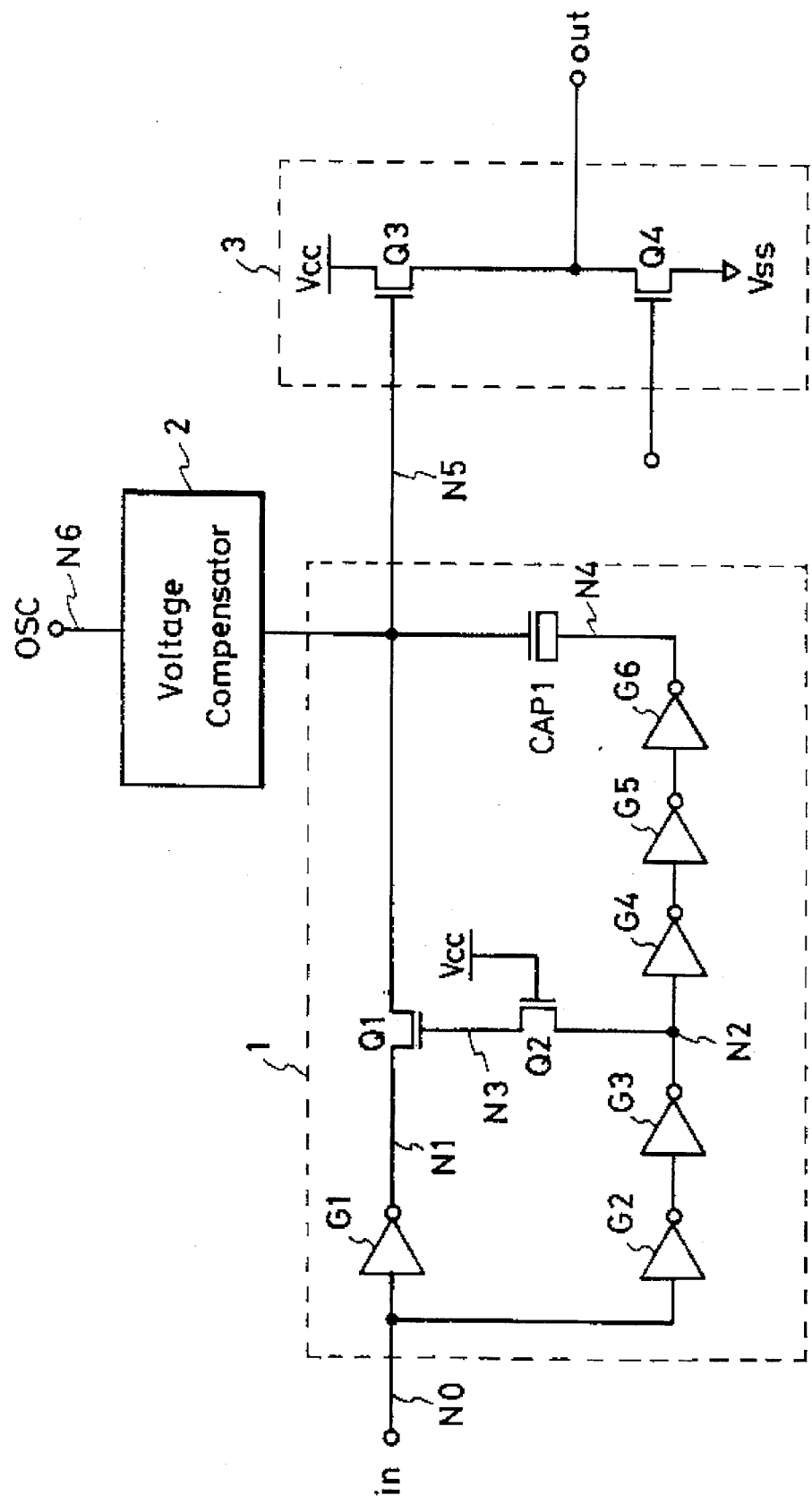
FIG. 1 is a circuit diagram of a conventional bootstrap circuit for a data output buffer of a semiconductor memory device.
Figure 2:
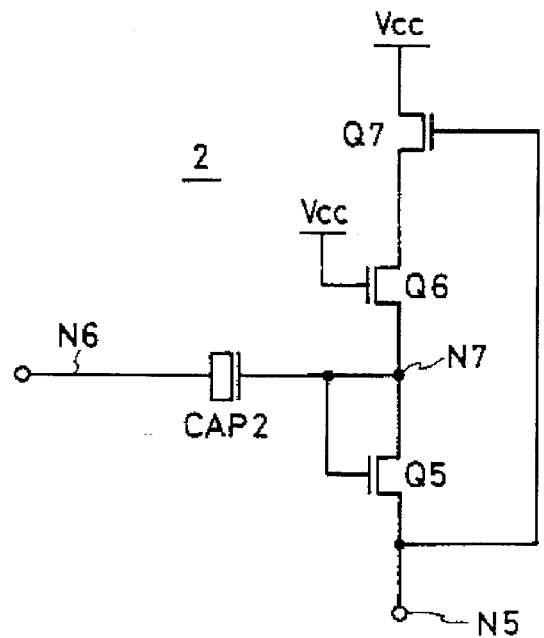
FIG. 2 is a detailed circuit diagram of a voltage compensator in FIG. 1.

To boost the data signal, the booster 10 has the same construction as that of the booster 1 in FIG. 1. Namely, the booster 10 includes the two NMOS transistors Q1 and Q2, the six inverters G1–G6 and the capacitor CAP1. The voltage compensator 11 is adapted to input the pulse signal from the ring oscillator (not shown) through the node N6 and perform a voltage pumping operation in response to the inputted pulse signal. To this end, the voltage compensator 11 has the same construction as that of the voltage compensator 2 in FIG. 2. Namely, the voltage compensator 11 includes the capacitor CAP2 and the three NMOS transistors Q5–Q7. The data output buffer 12 includes the two NMOS transistors Q3 and Q4 similarly to the data output buffer 3 in FIG. 1. Because the constructions and operations of the booster 10, the voltage compensator 11 and the data output buffer 12 are the same as those of the booster 1, the voltage compensator 2 and the data output buffer 3 in FIGS. 1 and 2, a description thereof will thus be omitted.

Further, the improved bootstrap circuit comprises a voltage detector 13 for detecting the supply voltage, and an active load 14 for adjusting an output load amount of the booster 10 in accordance with the result detected by the voltage detector 13. The voltage detector 13 generates a voltage detect signal which is high in logic when the supply voltage is high, whereas low in logic when the supply voltage is low. The voltage detect signal from the voltage detector 13 is applied to the active load 14 through a node N8.

The active load 14 increases the output load amount of the booster 10 when the voltage detect signal from the voltage detector 13 is high in logic or a level of the supply voltage is higher than a predetermined level. On the contrary, the active load 14 reduces the output load amount of the booster 10 when the voltage detect signal from the voltage detector 13 is low in logic or the level of the supply voltage is lower that the predetermined level.

To this end, the active load 14 includes a capacitor CAP3 connected between the output node N5 of the booster 10 and a second supply voltage source Vss and an NMOS transistor Q8 connected between the output node N5 of the booster 10 and the capacitor CAP3. The NMOS transistor Q8 has a gate for inputting the voltage detect signal from the output node N8 of the voltage detector 13. When the voltage detect signal from the output node N8 of the voltage detector 13 is high in logic, the NMOS transistor Q8 is turned on to connect the capacitor CAP3 to the output node N5 of the booster 10. As being connected to the output node N5 of the booster 10 by the NMOS transistor Q8, the capacitor CAP3 increases the output load amount of the booster 10 and is charged with the voltage at the output node N5 of the booster 10.

Figure 4:
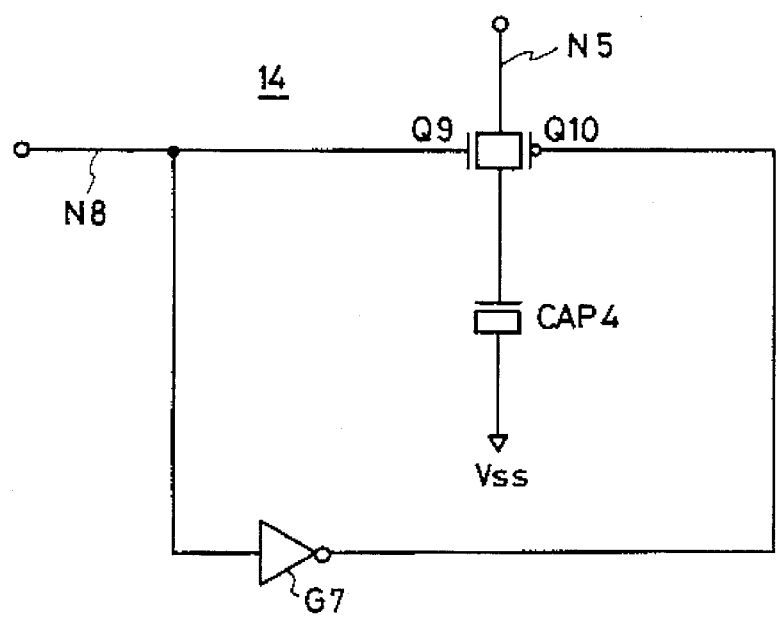
FIG. 4 is a detailed circuit diagram of an active load in FIG. 3 in accordance with an alternative embodiment of the present invention.

FIG. 4 is a detailed circuit diagram of the active load 14 in FIG. 3 in accordance with an alternative embodiment of the present invention. As shown in this drawing, the active load 14 includes a capacitor CAP4 connected to an output terminal of the booster 10 in FIG. 3 through the node N5, and an NMOS transistor Q9 and a PMOS transistor Q10 connected in parallel between the node N5 and the capacitor CAP4. The NMOS transistor Q9 has a gate for inputting the voltage detect signal from the voltage detector 13 in FIG. 3 through the node N8. When the voltage detect signal from the voltage detector 13 is high logic, the NMOS transistor Q9 is turned on to connect the capacitor CAP4 to the booster 10 through the node N5. Further, the active load 14 includes an inverter G7 for inputting the voltage detect signal from the voltage detector 13 through the node N8, inverting the inputted voltage detect signal and outputting the inverted voltage detect signal to a gate of the PMOS transistor Q10. When the voltage detect signal from the voltage detector 13 is high in logic, the PMOS transistor Q10 is turned on by the low logic signal from the inverter G7 to form a parallel path with the NMOS transistor Q9. The parallel path formed by the PMOS and NMOS transistors Q10 and Q9 minimizes a reduction in an amount of current flowing from the node N5 to the capacitor CAP4. As being connected to the output node N5 of the booster 10 by the NMOS and PMOS transistors Q9 and Q10, the capacitor CAP4 increases the output load amount of the booster 10 and is charged with the voltage at the output node N5 of the booster 10.

Figure 5:
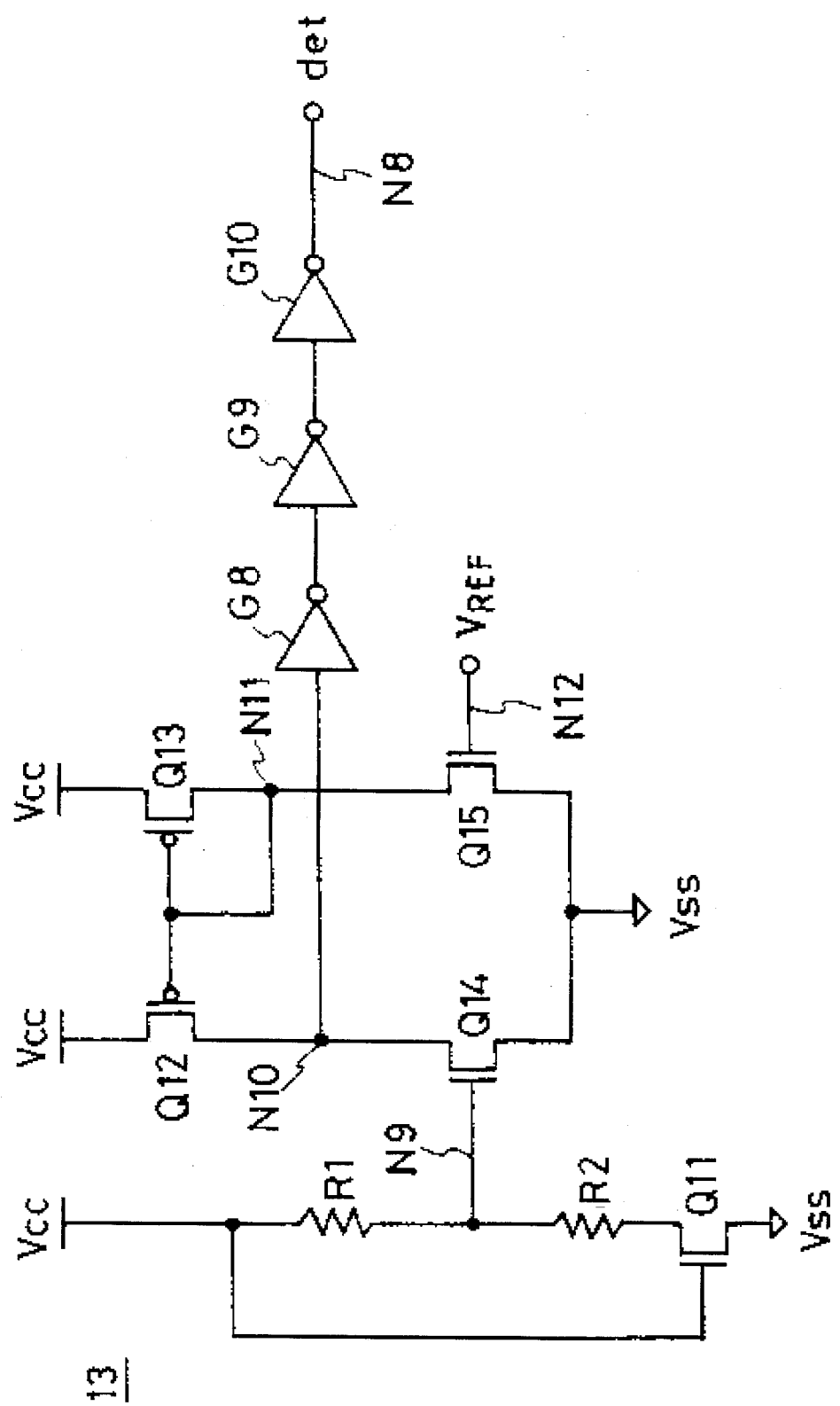
FIG. 5 is a detailed circuit diagram of a voltage detector in FIG. 3.

Referring to FIG. 5, there is shown a detailed circuit diagram of the voltage detector 13 in FIG. 3. As shown in this drawing, the voltage detector 13 includes a voltage divider 15 for dividing a supply voltage Vcc–Vss and outputting the divided voltage through a node N9, and a differential amplifier 16 for inputting an output voltage from the voltage divider 15 through the node N9 and a reference voltage $V_{REF}$ through a node N12 and comparing the inputted voltages with each other.

The voltage divider 15 includes a resistor R1 connected between the first supply voltage source Vcc and the node N9, and a resistor R2 and an NMOS transistor Q11 connected in series between the node N9 and the second supply voltage source Vss. The NMOS transistor Q11 has a gate connected to the first supply voltage source Vcc and acts as a resistor. The divided voltage at the node N9 can be defined by the following equation (1) on the basis of a ratio of a combined resistance of the resistor R2 and the NMOS transistor Q11 to a resistance of the resistor R1:

$$Vd=(Vcc-Vss)(R2+R_{Q11})/(R1+R2+R_{Q11}) \qquad (1)$$

where, Vd is the divided voltage at the node N9 and $R_{Q11}$ is a resistance of the NMOS transistor Q11.

The differential amplifier 16 includes two PMOS transistors Q12 and Q13 connected in a current mirror form between the first supply voltage source Vcc and two nodes N10 and N11, and two NMOS transistors Q14 and Q15 connected respectively between the second supply voltage source Vss and the nodes N10 and N11. The NMOS transistor Q14 has a gate for inputting the divided voltage Vd from the node N9 and the NMOS transistor Q15 has a gate for inputting the reference voltage $V_{REF}$ through the node N12. The NMOS transistor Q14 generates a comparison signal to the node N10 as a result of the comparison of the divided voltage Vd with the reference voltage $V_{REF}$. Namely, if the divided voltage Vd is higher than the reference voltage $V_{REF}$, the NMOS transistor Q14 generates the comparison signal of low logic to the node N10. On the contrary, the divided voltage Vd is lower than the reference voltage $V_{REF}$, the NMOS transistor Q14 generates the comparison signal of high logic to the node N10.

Further, the differential amplifier 13 includes three inverters G8–G10 connected in series to the node N10. The three inverters G8–G10 invert the comparison signal from the node N10 and transfer the inverted signal as the voltage detect signal to the active load 14 in FIGS. 3 and 4 through the node N8. The voltage detect signal to the node N8 is high in logic when the supply voltage Vcc–Vss is high or the divided voltage Vd is higher than the reference voltage $V_{REF}$. On the contrary, the voltage detect signal to the node N8 is low in logic when the supply voltage Vcc–Vss is low or the divided voltage Vd is lower than the reference voltage $V_{REF}$.

As apparent from the above description, according to the present invention, the improved bootstrap circuit adjusts the output load amount according to the variation of the supply voltage so that the boosted voltage of the input signal can be maintained constantly and stably. Therefore, the improved bootstrap circuit of the present invention has the effect of preventing a degradation in the operation speed of the semiconductor memory device and enhancing the reliability thereof.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An improved bootstrap circuit comprising:

boosting means for boosting a binary signal and outputting the booster binary signal through its output terminal;

voltage detection means for detecting a variation in a supply voltage from a supply voltage source;

an active load for adjusting an output load amount of said boosting means under control of said voltage detection means, comprising voltage storing means connected to said output terminal of said boosting means, for storing a voltage therefrom to compensate a power thereon; and control switching means connected between said boosting means and said voltage storage means, and controlled by said voltage detection means for selectively providing voltage from said storing means to said output terminal of said boosting means in response to an output signal from said voltage detecting means.

2. An improved bootstrap circuit as set forth in claim 1, wherein said control switching means includes an NMOS transistor for connecting said voltage storing means to said output terminal of said boosting means when the output signal from said voltage detection means is high in logic.

3. An improved bootstrap circuit as set forth in claim 2, wherein said switching means further includes:

inverting means for inverting the output signal from said voltage detection means; and a PMOS transistor connected in parallel to said NMOS transistor, said PMOS transistor being driven in response to an output signal from said inverting means.

4. An improved bootstrap circuit as set forth in claim 1, further comprising:

pulse generation means for generating a pulse signal; and voltage compensation means for supplying periodically a desired voltage to said output terminal of said boosting means in response to the pulse signal from said pulse generation means to compensate for a voltage loss of the boosted binary signal from said boosting means.

* * * * *